United States Patent
van Meer et al.

(10) Patent No.: US 9,437,740 B2
(45) Date of Patent: Sep. 6, 2016

(54) EPITAXIALLY FORMING A SET OF FINS IN A SEMICONDUCTOR DEVICE

(71) Applicant: GLOBALFOUNDRIES Inc., Grand Cayman (KY)

(72) Inventors: Johannes M. van Meer, Newburgh, NY (US); Michael J. Hargrove, Clinton Corners, NY (US); Christian Gruensfelder, Dresden (DE); Yanxiang Liu, Glenville, NY (US); Srikanth B. Samavedam, Cohoes, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/686,228

(22) Filed: Apr. 14, 2015

(65) Prior Publication Data

US 2015/0221770 A1 Aug. 6, 2015

Related U.S. Application Data

(63) Continuation of application No. 13/956,475, filed on Aug. 1, 2013, now Pat. No. 9,034,737.

(51) Int. Cl.
| | |
|---|---|
| *H01L 27/088* | (2006.01) |
| *H01L 29/78* | (2006.01) |
| *H01L 21/8238* | (2006.01) |
| *H01L 29/66* | (2006.01) |
| *H01L 29/16* | (2006.01) |
| *H01L 21/02* | (2006.01) |

(52) U.S. Cl.
CPC ...... *H01L 29/7856* (2013.01); *H01L 21/02636* (2013.01); *H01L 21/823807* (2013.01); *H01L 21/823821* (2013.01); *H01L 29/1608* (2013.01); *H01L 29/66795* (2013.01); *H01L 29/7855* (2013.01)

(58) Field of Classification Search
None
See application file for complete search history.

(56) References Cited

U.S. PATENT DOCUMENTS 8,703,556 B2 * 4/2014 Kelly ............... H01L 29/66795
257/296

OTHER PUBLICATIONS

Yoshida et al., "A Full FinFET DRAM Core Integration Technology Using a Simple Selective Fin Formation Technique", 2006 Symposium on VLSI Technology Digest of Technical Papers, 2 pages.
Basker et al., "A 0.063 um2 FinFET SRAM cell demonstration with conventional lithography using a novel Integration scheme with aggressively scaled fin and gate pitch", 2010 Symposium on VLSI Technology Digest of Technical Papers, pp. 19-20.

(Continued)

*Primary Examiner* — Sonya D McCall Shepard
(74) *Attorney, Agent, or Firm* — Williams Morgan, P.C.

(57) ABSTRACT

Approaches for enabling epitaxial growth of silicon fins in a device (e.g., a fin field effect transistor device (FinFET)) are provided. Specifically, approaches are provided for forming a set of silicon fins for a FinFET device, the FinFET device comprising: a set of gate structures formed over a substrate, each of the set of gate structures including a capping layer and a set of spacers; an oxide fill formed over the set of gate structures; a set of openings formed in the device by removing the capping layer and the set of spacers from one or more of the set of gate structures; a silicon material epitaxially grown within the set of openings in the device and then planarized; and wherein the oxide fill is etched to expose the silicon material and form the set of fins.

7 Claims, 10 Drawing Sheets

(56) References Cited

OTHER PUBLICATIONS

Yamashita et al., "Sub-25nm FinFET with Advanced Fin Formation and Short Channel Effect Engineering", 2011 Symposium on VLSI Technology Digest of Technical Papers, pp. 14-15.

Zaman et al., "Trigate FET Device Characteristics Improvement Using a Hydrogen Anneal Process With a Novel Hard Mask Approach", IEEE Electron Device Letters, vol. 28, No. 10, Oct. 2007, pp. 916-918.

* cited by examiner

EPITAXIALLY FORMING A SET OF FINS IN A SEMICONDUCTOR DEVICE

CROSS-REFERENCE TO RELATED APPLICATIONS

This application is a continuation of co-pending U.S. application Ser. No. 13/956,475, filed on Aug. 1, 2013.

BACKGROUND

1. Technical Field

This invention relates generally to the field of semiconductors, and more particularly, to forming a set of fins in a semiconductor device using selective epitaxial (epi) growth.

2. Related Art

A typical integrated circuit (IC) chip includes a stack of several levels or sequentially formed layers of shapes. Each layer is stacked or overlaid on a prior layer and patterned to form the shapes that define devices (e.g., field effect transistors (FETs)) and connect the devices into circuits. In a typical state of the art complementary insulated gate FET process, such as what is normally referred to as CMOS, layers are formed on a wafer to form the devices on a surface of the wafer. Further, the surface may be the surface of a silicon layer on a silicon on insulator (SOI) wafer. A simple FET is formed by the intersection of two shapes, a gate layer rectangle on a silicon island formed from the silicon surface layer. Each of these layers of shapes, also known as mask levels or layers, may be created or printed optically through well known photolithographic masking, developing and level definition, e.g., etching, implanting, deposition, etc.

The fin-shaped field effect transistor (FinFET) is a transistor design that attempts to overcome the issues of short-channel effect encountered by deep submicron transistors, such as drain-induced barrier lowering (DIBL). Such effects make it harder for the voltage on a gate electrode to deplete the channel underneath and stop the flow of carriers through the channel—in other words, to turn the transistor off. By raising the channel above the surface of the wafer instead of creating the channel just below the surface, it is possible to wrap the gate around all but one of its sides, providing much greater electrostatic control over the carriers within it.

FinFET architecture typically takes advantage of self-aligned process steps to produce narrow features that are much smaller than the wavelength of light that is generally used to pattern devices on a silicon wafer. It is possible to create very thin fins (e.g., 20 nm in width or less) on the surface of a silicon wafer using selective-etching processes (e.g., dry etching of silicon). However, conventional techniques have at least the following limitations: in the case of a bulk wafer, the fins have a different height depending on the density of the fins; and in the case of an SOI wafer, punch-through leakage along the fin channel is possible, which significantly contributes to overall device leakage.

SUMMARY

In general, approaches for enabling epitaxial (epi) growth of silicon fins in a semiconductor device (e.g., a fin field effect transistor device (FinFET)) are provided. Specifically, approaches are provided for forming a set of silicon fins for a FinFET device, the FinFET device comprising: a set of gate structures formed over a substrate, each of the set of gate structures including a capping layer and a set of spacers; an oxide fill formed over the set of gate structures; a set of openings formed in the device by removing the capping layer and the set of spacers from one or more of the set of gate structures; a silicon material epitaxially grown within the set of openings in the device and then planarized; and wherein the oxide fill is etched to expose the silicon material and form the set of fins. In one approach, a set of well implants is formed in the substrate (e.g., using an isolation implant), wherein the silicon material is epitaxially grown over the set of well implants. A diffusion barrier layer may also be formed between the silicon material and the set of well implants to improve electrical isolation of the fins.

One aspect of the present invention includes a method for forming a device, the method comprising: forming a set of gate structures over a substrate, each of the set of gate structures comprising a capping layer and a set of spacers; forming an oxide fill over the set of gate structures; removing the capping layer and the set of spacers from one or more of the set of gate structures to form a set of openings in the device; epitaxially growing a silicon material within the set of openings in the device; planarizing the silicon material; and etching the oxide fill to expose the silicon material.

Another aspect of the present invention includes a method for epitaxially forming a set of fins in a semiconductor device, the method comprising: forming a set of gate structures over a substrate, each of the set of gate structures comprising a capping layer and a set of spacers; forming an oxide fill over the set of gate structures; removing the capping layer and the set of spacers from one or more of the set of gate structures to form a set of openings in the device; epitaxially growing a silicon material within the set of openings in the device; planarizing the silicon material; and etching the oxide fill to expose the silicon material.

Yet another aspect of the present invention includes a method for epitaxially forming a set of fins in a semiconductor device, the method comprising: forming a set of gate structures over a substrate, each of the set of gate structures comprising a capping layer and a set of spacers; forming an oxide fill over the set of gate structures; removing the capping layer and the set of spacers from one or more of the set of gate structures to form a set of openings in the device; forming a set of well implants in the substrate; forming a diffusion barrier layer over the set of well implants; epitaxially growing a silicon material over the set of well implants within the set of openings in the device; planarizing the silicon material; and etching the oxide fill to expose the silicon material forming the set of fins.

BRIEF DESCRIPTION OF THE DRAWINGS

These and other features of this invention will be more readily understood from the following detailed description of the various aspects of the invention taken in conjunction with the accompanying drawings in which.

DETAILED DESCRIPTION

Figure 1A:
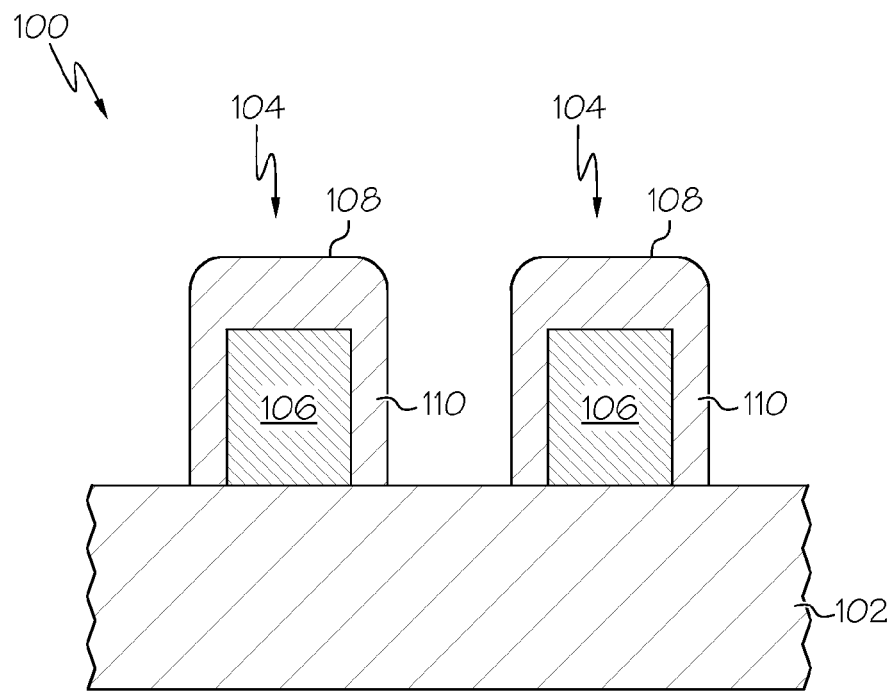
FIGS. 1(a)-1(j) show cross-sectional views of an approach for forming a semiconductor device in which a set of silicon fins are epitaxially grown according to illustrative embodiments.
Figure 1B:
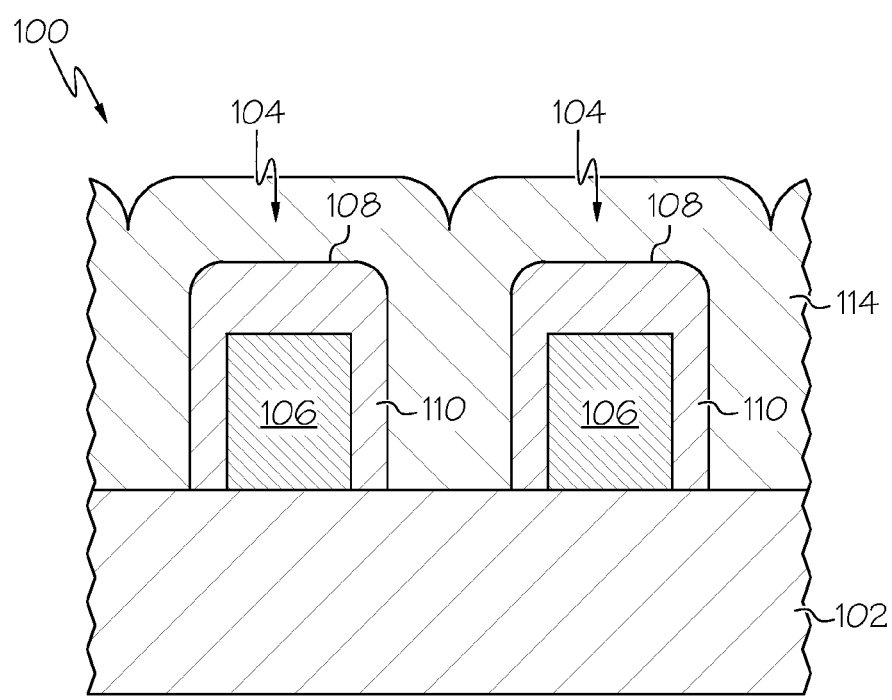
Figure 1C:
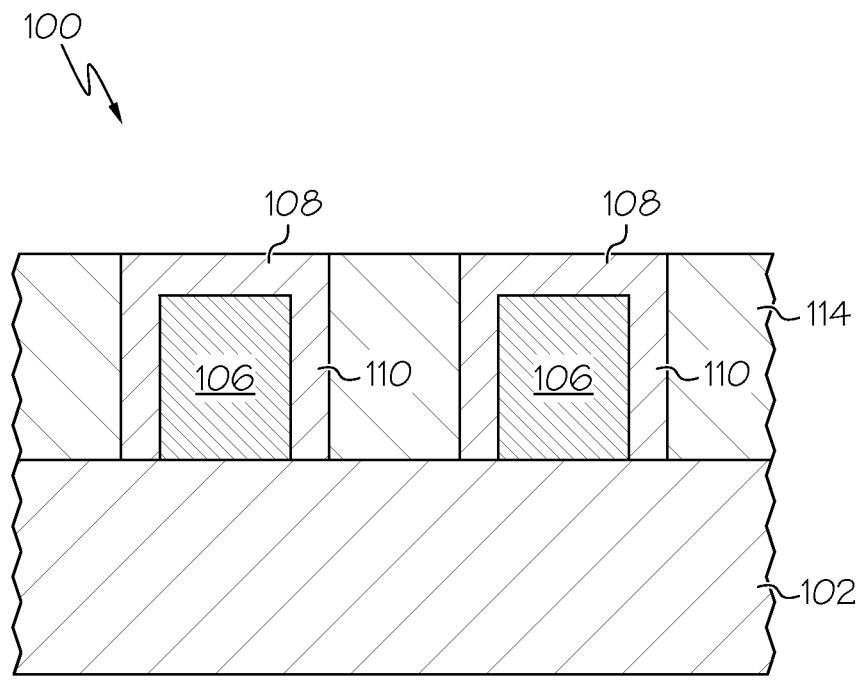
Figure 1D:
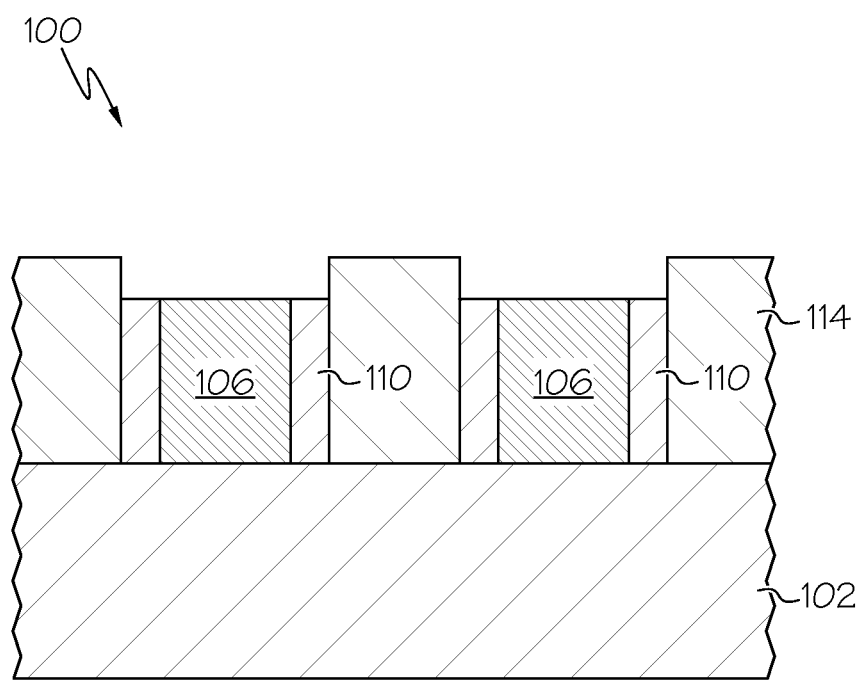
Figure 1E:
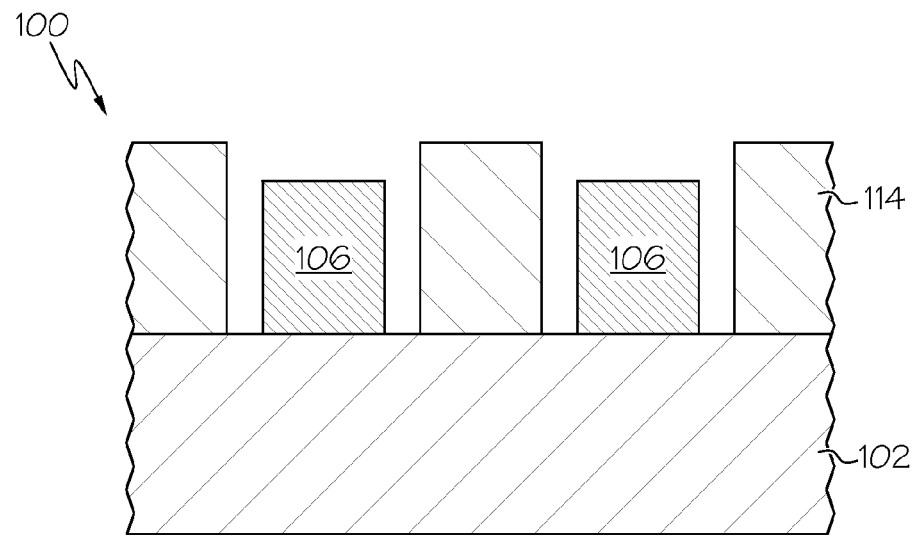
Figure 1F:
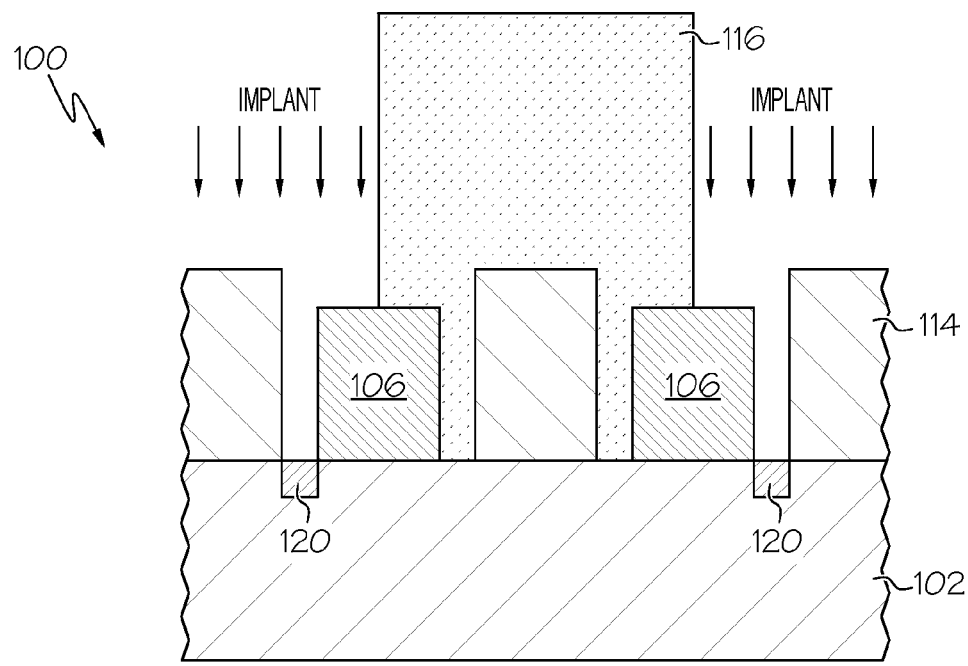
Figure 1G:
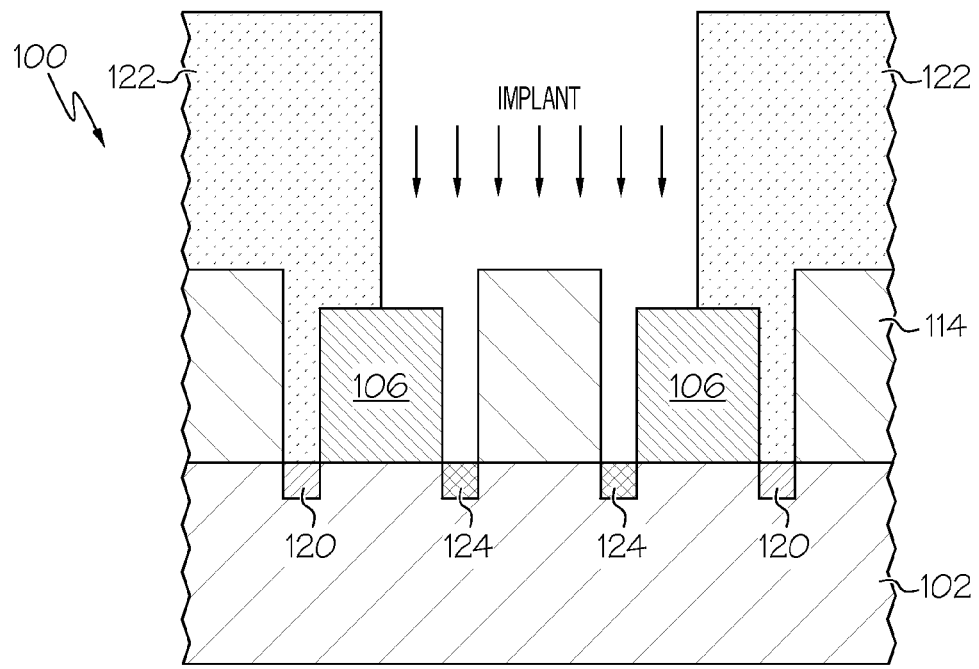
Figure 1H:
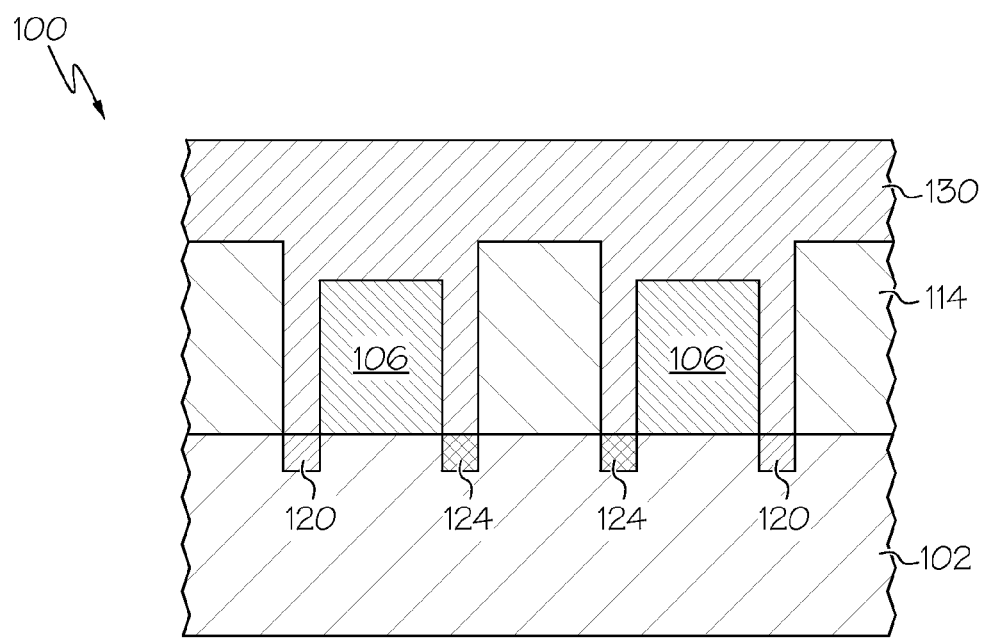
Figure 1I:
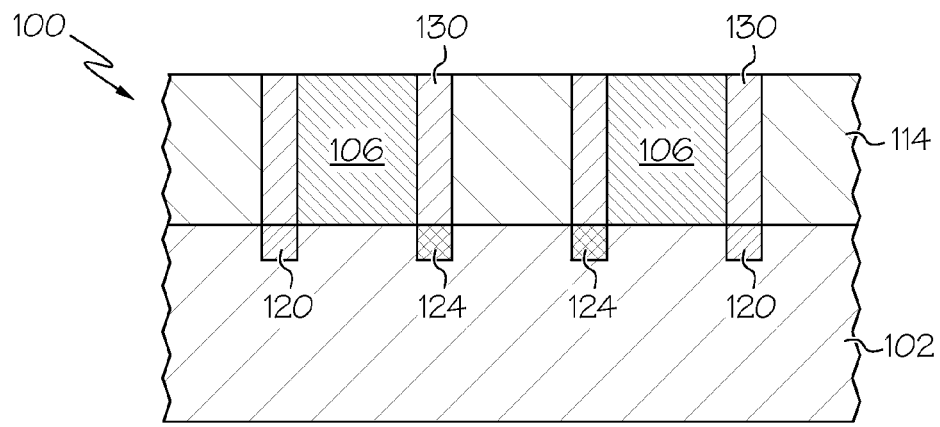
Figure 1J:
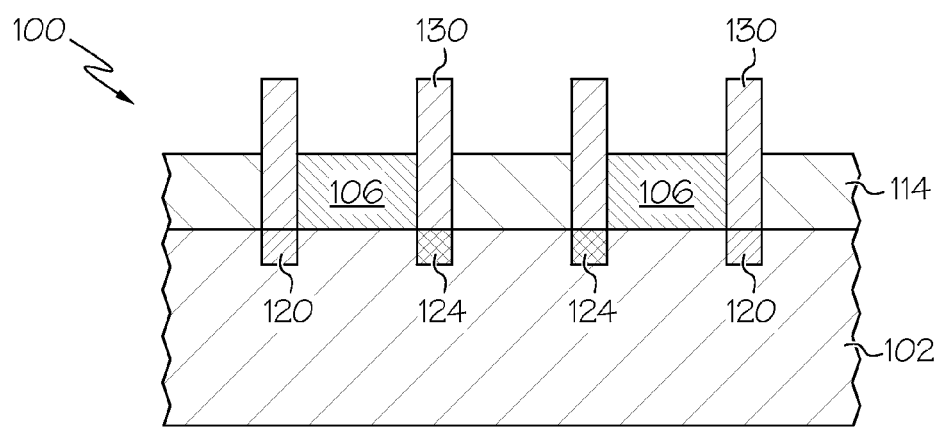

Exemplary embodiments will now be described more fully herein with reference to the accompanying drawings, in which exemplary embodiments are shown. It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art.

As mentioned above, disclosed herein are approaches for epitaxially forming a set of silicon-based fins in a semiconductor device (e.g., a fin field effect transistor device (FinFET)). Specifically, approaches are provided for forming a set of silicon fins for a FinFET device, the FinFET device comprising: a set of gate structures formed over a substrate, each of the set of gate structures including a capping layer and a set of spacers; an oxide fill formed over the set of gate structures; a set of openings formed in the device by removing the capping layer and the set of spacers from one or more of the set of gate structures; a silicon material epitaxially grown within the set of openings in the device and then planarized; and wherein the oxide fill is etched to expose the silicon material and form the set of fins. In one approach, a set of well implants is formed in the substrate (e.g., using an isolation implant), wherein the silicon material is epitaxially grown over the set of well implants. A diffusion barrier layer may also be formed between the silicon material and the set of well implants to improve electrical isolation of the fins.

The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

As used herein, "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

With reference now to the figures, FIGS. 1(a)-1(j) show cross sectional views of an approach for forming a set of silicon-based fins in a semiconductor device according to an embodiment of the invention. As shown in FIG. 1(a), device 100 comprises a substrate 102 and a set of gate structures 104 (e.g., dummy gate FinFETs), formed over the substrate 102. Each gate structure 104 comprises a gate oxide 106, and a capping layer 108 (e.g., silicon nitride (SiN) formed atop gate oxide 106. Gate oxide 106 and capping layer 108 may be formed using processes such as, physical vapor deposition (PVD), CVD, plasma-enhanced chemical vapor deposition (PECVD), atmospheric pressure chemical vapor deposition (APCVD), low-pressure CVD (LPCVD), high density plasma CVD (HD CVD), atomic layer CVD (ALCVD), and/or other suitable processes which may be followed, for example, by photolithography and/or etching processes. Furthermore, each gate structure 104 comprises a set of spacers 110 formed along the sidewalls thereof. An optional liner, such as silicon dioxide, may be interposed between each spacer 110 and gate oxide 106.

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith. A portion or entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped or contain doped regions and undoped regions therein. The semiconductor substrate may contain regions with strain and regions without strain therein, or contain regions of tensile strain and compressive strain.

Gate structures 104 may be fabricated using any suitable process including one or more photolithography and etch processes. The photolithography process may include forming a photoresist layer (not shown) overlying substrate 102 (e.g., on a silicon layer), exposing the resist to a pattern, performing post-exposure bake processes, and developing the resist to form a masking element including the resist. The masking element may then be used to etch each gate 104 into the silicon layer, e.g., using reactive ion etch (RIE) and/or other suitable processes.

In one embodiment, gate structures 104 are formed by a double-patterning lithography (DPL) process. DPL is a method of constructing a pattern on a substrate by dividing the pattern into two interleaved patterns. DPL allows enhanced feature (e.g., fin) density. In this embodiment, gate structures 104 each include a gate electrode. Numerous other layers may also be present, for example, a gate dielectric layer, interface layers, and/or other suitable features. The gate dielectric layer may include dielectric material such as, silicon oxide, silicon nitride, silicon oxinitride, dielectric with a high dielectric constant (high k), and/or combinations thereof. Examples of high k materials include hafnium silicate, hafnium oxide, zirconium oxide, aluminum oxide, hafnium dioxide-alumina ($HfO_2$—$Al_2O_3$) alloy, and/or combinations thereof. The gate dielectric layer may be formed using processes such as, photolithography patterning, oxidation, deposition, etching, and/or other suitable processes. The gate electrode may include polysilicon, silicon-germanium, a metal including metal compounds such as, Mo, Cu, W, Ti, Ta, TiN, TaN, NiSi, CoSi, and/or other suitable conductive materials known in the art. The gate electrode may be formed using processes such as, physical vapor deposition (PVD), CVD, plasma-enhanced chemical vapor deposition (PECVD), atmospheric pressure chemical vapor deposition (APCVD), low-pressure CVD (LPCVD), high density plasma CVD (HD CVD), atomic layer CVD (ALCVD), and/or other suitable processes which may be followed, for example, by photolithography and/or etching processes.

Next, as shown in FIG. 1(*b*), an oxide fill material 114 is deposited over gate structures 104 and planarized (e.g., using chemical mechanical planarization (CMP)) selective to capping layer 108, as shown in FIG. 1(*c*), and capping layer 108 is then removed (FIG. 1(*d*)).

As shown in FIG. 1(*e*), set of spacers 110 is then removed from each gate structure to form a set of openings in device 100. In one embodiment, removing set of spacers 110 comprises etching the SiN of each spacer 110 using a phosphorous acid solution. Specifically, an acid solution containing phosphoric acid at a temperature in the range of 100 to 150° C., preferably at 140° C., is used as an etchant to remove SiN spacers 110, while leaving gate oxide 106 intact. The acid solution containing phosphoric acid may contain any concentration of phosphoric acid in water, provided the acid solution exhibits an etching ability to spacers 110. Preferably, the phosphoric acid concentration ranges from about 50 to about 100% depending on etching temperatures, and is more preferably 79.5% when the etching temperature is set at 140° C. The acid solution may optionally contain additional agents, such as buffering agents and/or other acids like fluoboric acid and sulfuric acid. For effectively removing spacers using the acid solution containing phosphoric acid as an etchant at 150° C. or lower, the acid solution containing phosphoric acid may require a pretreatment before use.

Next, as shown in FIG. 1(*f*), a photoresist (PR) 116 is formed over a portion of device 100 (e.g., a p-channel field-effect transistor (PFET) fin region), and an n-channel field-effect transistor (NFET) fin isolation implant is performed to form a set of well implants 120 in substrate 102 for the n-channel fins. As shown, each well implant 120 is formed in substrate 102 in an area beneath the openings left exposed by PR 116. PR 116 is then removed, and a second PR 122 is formed over a portion of device 100 (e.g., an NFET fin region), as shown in FIG. 1(*g*). A PFET fin isolation implant is subsequently performed to form a second set of well implants 124 in substrate 102 for the p-channel fins. In this embodiment, it will be appreciated that each implantation process may be carried out by doping dopant species, such as N type dopant species (e.g., arsenic, antimony or phosphorous) for making an NMOS, or P type dopant species (e.g., boron) for making a PMOS in silicon substrate 102. After the implantation, the substrate may be subjected to an annealing and/or activation thermal process that is known in the art.

Second PR 122 is then removed, and a silicon material 130 is formed over device 100 including within each opening formed by spacer removal, as shown in FIG. 1(*h*). In this embodiment, silicon material 130 comprises epitaxial silicon (e-Si), which is grown in the openings, and may be in-situ doped. Silicon material 130 is then planarized (e.g., via CMP) stopping on oxide 114, as shown in FIG. 1(*i*). In this embodiment, silicon material 130 is etched to remove substantially all of the Si except for the portions within the openings formed by the spacer removal. Finally, oxide fill 114 is etched back to expose silicon material 130 of the set of fins.

Figure 2A:
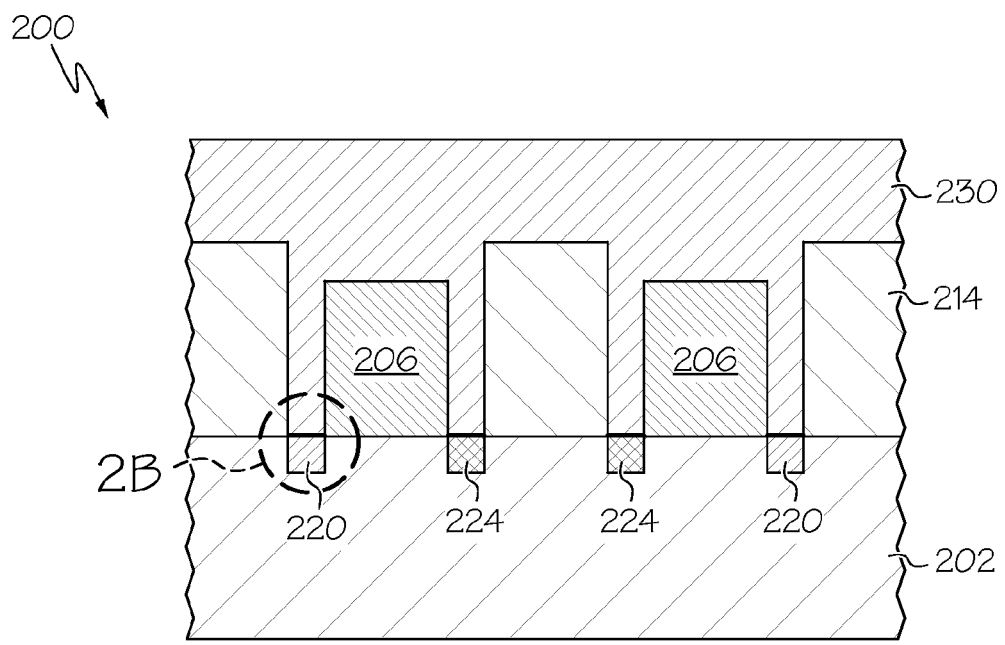
FIGS. 2(a)-2(b) show cross-sectional views of a semiconductor device formed with a diffusion barrier layer beneath the silicon fins according to illustrative embodiments.
Figure 2B:
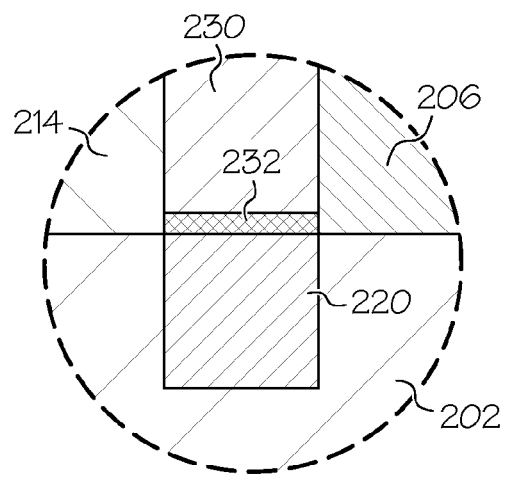
Figure 3A:
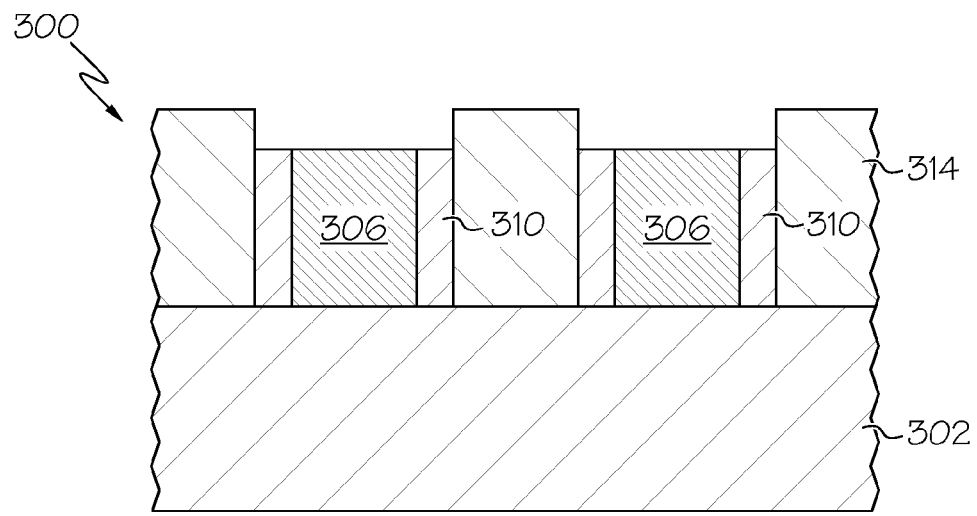
FIGS. 3(a)-3(d) show cross-sectional views of another approach for forming a semiconductor device in which a set of fins are epitaxially grown according to illustrative embodiments.
Figure 3B:
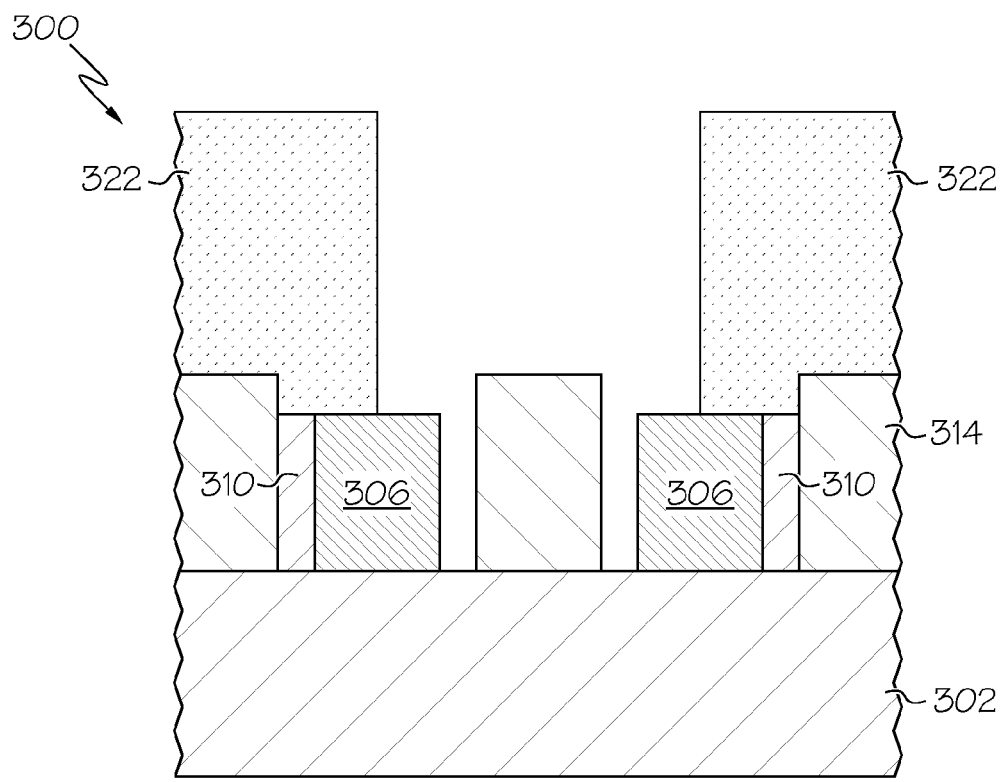
Figure 3C:
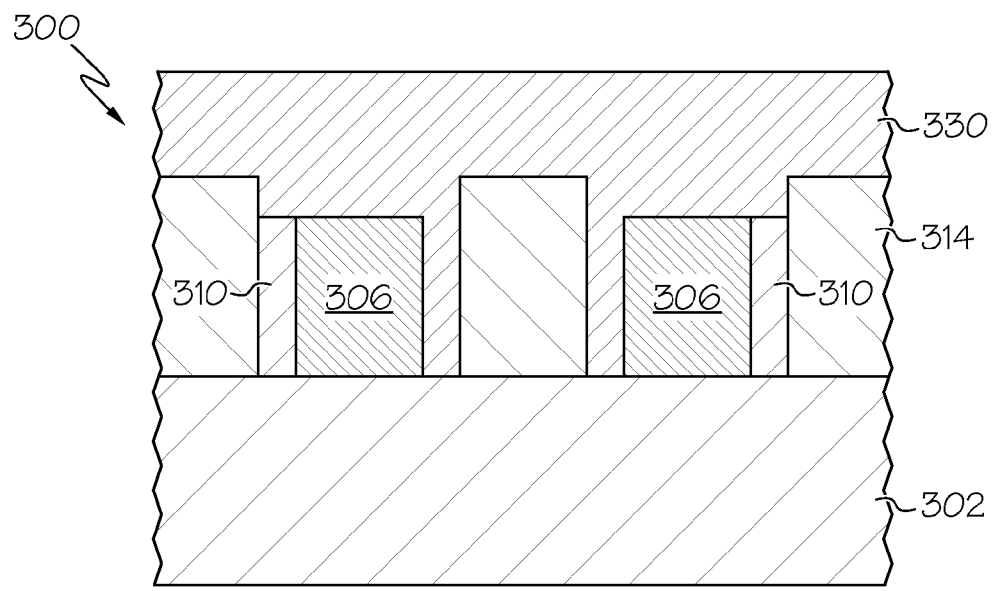
Figure 3D:
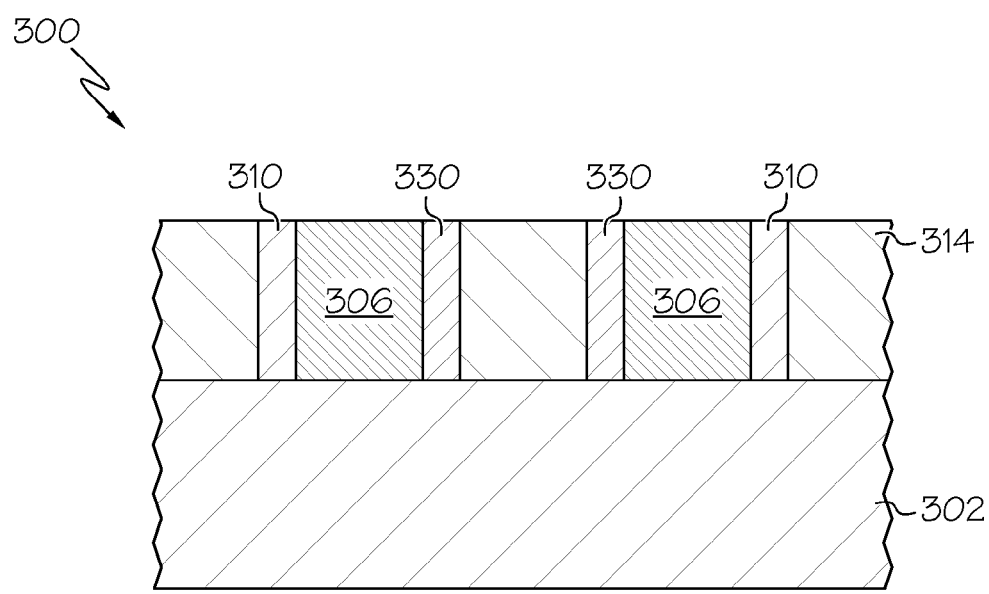
Figure 4A:
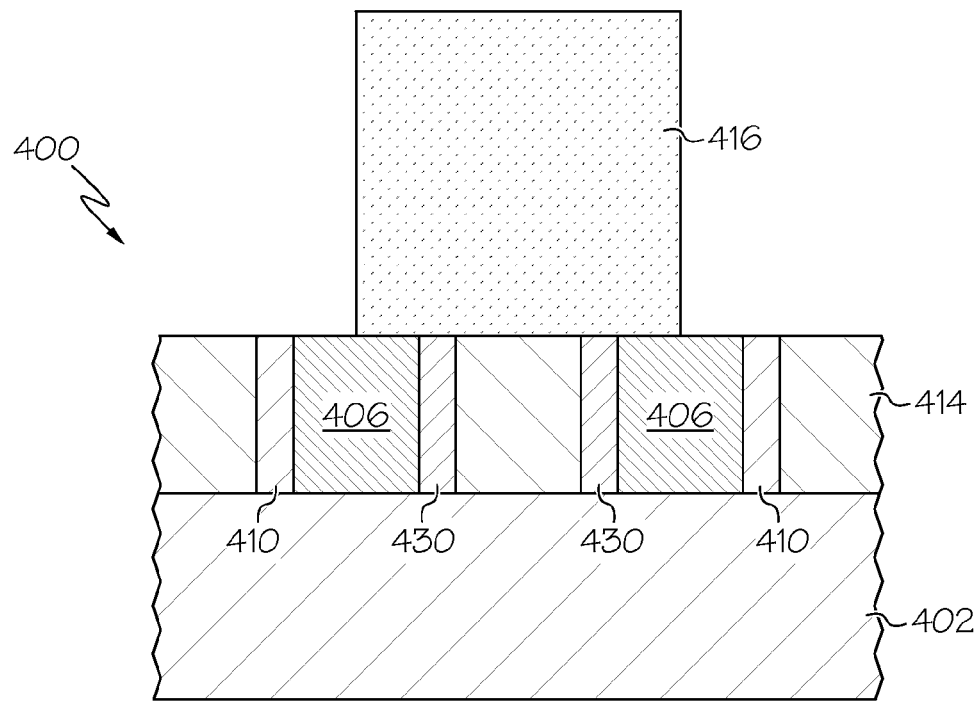
FIGS. 4(a)-4(d) show cross-sectional views of another approach for forming a semiconductor device in which a set of fins are epitaxially grown according to illustrative embodiments; and The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.
Figure 4B:
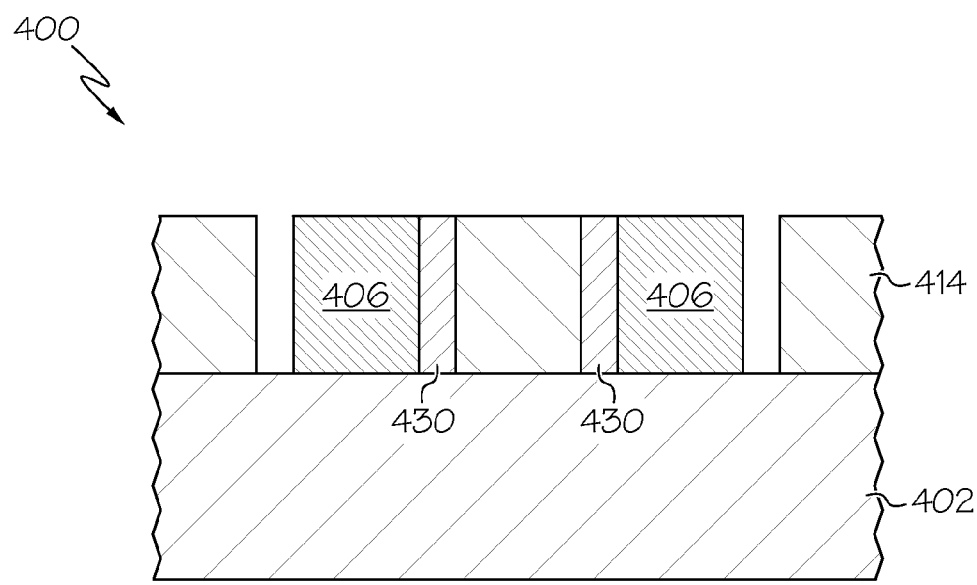
Figure 4C:
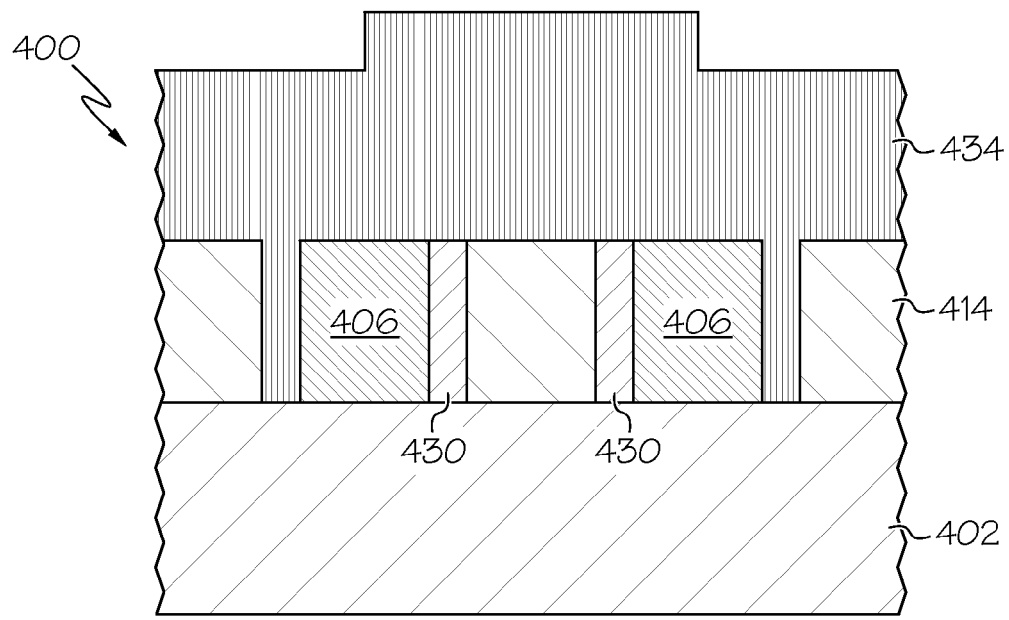
Figure 4D:
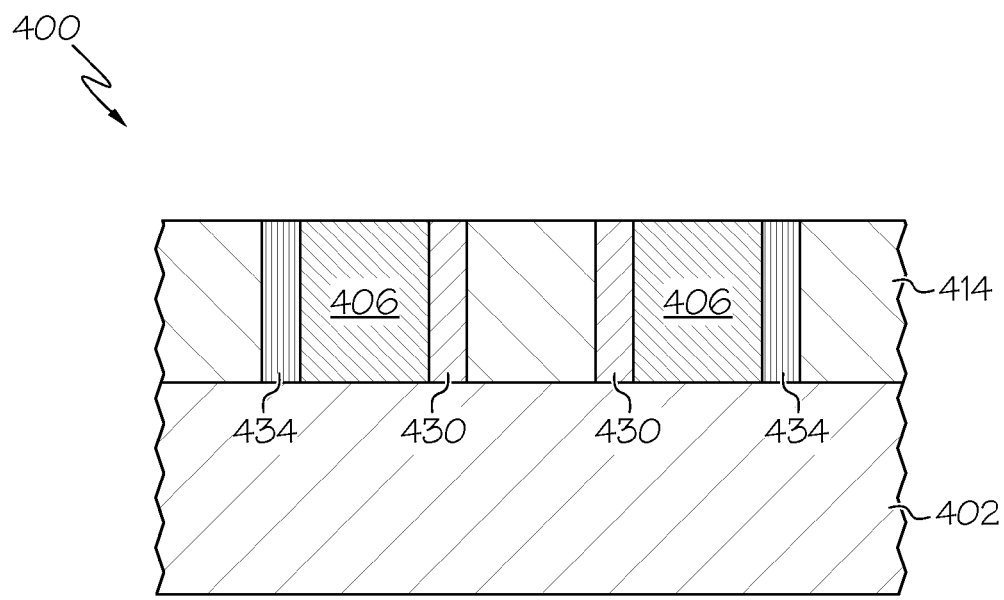

In one embodiment, the semiconductor device of the present invention further comprises a diffusion barrier layer to improve electrical isolation of the fins. This is demonstrated in FIGS. 2(*a*)-2(*b*), which depict a structure 200 including a Silicon-Carbon (Si—C) diffusion barrier layer 232 formed over each of well implants 220 and 224. In this embodiment, Si—C diffusion barrier layer 232 is epitaxially grown over first and second set of well implants 220 and 224 in substrate 202, and then covered by silicon material 230. Having Si—C diffusion barrier layer 232 on N-type and P-type fins helps suppress boron diffusion for N-type fins.

Turning now to FIGS. 3(*a*)-3(*d*), another approach for forming a set of silicon-based fins in a semiconductor device will be shown and described. In this embodiment, device 300 similarly comprises gate oxide 306 and oxide fill 314 formed over substrate 302, and a set of sidewall spacers 310 formed along gate oxide 306, as shown in FIG. 3(*a*). PR 322 is formed over a portion of device 300 (e.g., an NFET fin region), as shown in FIG. 3(*b*), and the sidewall spacers 310 left exposed are removed (e.g., via a wet etch, dry etch, or combination of wet/dry) prior to P-channel fin formation. PR 322 is then removed, and silicon material 330 (e.g., SiGe or Si) is epitaxially grown over device 300 including within the openings formed by the removal of sidewall spacers 310 in the P-channel, as shown in FIG. 3(*c*). Silicon material 330 is then planarized (e.g., via CMP), stopping on oxide 306 and spacers 310, as shown in FIG. 3(*d*).

Turning now to FIGS. 4(*a*)-4(*d*), another approach for forming a set of silicon-based fins in a semiconductor device will be shown and described. In this embodiment, device 400 similarly comprises gate oxide 406 and oxide fill 414 formed over substrate 402, and a set of sidewall spacers 410 formed along gate oxide 406, as shown in FIG. 4(*a*). PR 416 is formed over a portion of device 400 (e.g., a PFET fin region) having silicon material 430 formed in a set of openings, and the sidewall spacers 410 left exposed are removed (e.g., via a wet etch, dry etch, or combination of wet/dry), as shown in FIG. 4(*b*). PR 416 is then removed, and silicon material 434 (e.g., SiC or Si) is epitaxially grown over device 400 including within the openings formed by the removal of sidewall spacers 410 in the N-channels, as shown in FIG. 4(*c*). Silicon material 434 is then planarized (e.g., via CMP), stopping on oxide 406, as shown in FIG. 4(d). As a result, device performance is improved, as SiGe and/or SiC is epitaxially grown to form fins for P-channel, and N-channel FinFets, respectively. The formation of SiGe and/or SiC fins is not feasible by means of conventional dry etching of fins on a bulk substrate or SOI substrate.

In various embodiments, design tools can be provided and configured to create the datasets used to pattern the semiconductor layers as described herein. For example data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

It is apparent that there has been provided methods for epitaxially forming a set of fins in a semiconductor device. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A FinFET device, comprising:
   a substrate;
   a set of gate structures disposed over the substrate and extending in a first direction;
   a set of oxide fill regions disposed over the substrate and extending in the first direction;
   a set of epitaxial silicon material regions disposed over the substrate;
   wherein each epitaxial silicon material region is adjacent to and is disposed between, in a second direction perpendicular to the first direction, a gate structure and an oxide fill region, and wherein each epitaxial silicon material region extends vertically above all the gate structures and all the oxide fill regions.

2. The FinFET device of claim 1, further comprising a set of well implants disposed in the substrate, wherein each well implant is disposed under an epitaxial silicon material region.

3. The FinFET device of claim 2, wherein the FinFET device comprises a p-channel field-effect transistor (PFET) region, and the well implants in the PFET region comprise boron.

4. The FinFET device of claim 2, wherein the FinFET device comprises an n-channel field-effect transistor (NFET) region, and the well implants in the NFET region comprise at least one of arsenic, antimony, or phosphorous.

5. The FinFET device of claim 2, further comprising a set of diffusion barriers, wherein each diffusion barrier is disposed under an epitaxial silicon material region and above a well implant.

6. The FinFET device of claim 1, wherein the FinFET device comprises a PFET region, and the epitaxial silicon material regions in the PFET region comprise at least one of silicon or silicon-carbon.

7. The FinFET device of claim 1, wherein the FinFET device comprises an NFET region, and the epitaxial silicon material regions in the NFET region comprise at least one of silicon or silicon-germanium.

* * * * *